United States Patent
Gesche

(10) Patent No.: US 8,545,764 B2
(45) Date of Patent: Oct. 1, 2013

(54) MICROPLASMA ARRAY

(75) Inventor: Roland Gesche, Seligenstadt (DE)

(73) Assignee: Forschungsverbund Berlin E.V., Berlin (DE)

( * ) Notice: Subject to any disclaimer, the term of this patent is extended or adjusted under 35 U.S.C. 154(b) by 1063 days.

(21) Appl. No.: 11/813,669

(22) PCT Filed: Jan. 11, 2006

(86) PCT No.: PCT/EP2006/050157
§ 371 (c)(1),
(2), (4) Date: Jul. 14, 2008

(87) PCT Pub. No.: WO2006/075008
PCT Pub. Date: Jul. 20, 2006

(65) Prior Publication Data
US 2009/0214402 A1    Aug. 27, 2009

(30) Foreign Application Priority Data
Jan. 12, 2005 (DE) .......................... 10 2005 002 142

(51) Int. Cl.
*B01J 19/08* (2006.01)
(52) U.S. Cl.
USPC ............... 422/186; 422/186.03; 422/186.04; 422/186.21; 422/186.29; 204/169; 204/164; 204/178; 118/723 E
(58) Field of Classification Search
USPC ................ 422/186, 186.03, 186.04, 186.21, 422/186.29; 204/169, 164, 178; 118/723 E
See application file for complete search history.

(56) References Cited

U.S. PATENT DOCUMENTS

| 3,662,214 A | 5/1972 | Lustig |
| 4,341,976 A | 7/1982 | Hanlet |
| 4,691,137 A * | 9/1987 | Goto et al. ........................ 313/30 |
| 5,686,789 A | 11/1997 | Schoenbach et al. |
| 6,129,856 A | 10/2000 | Jung et al. |
| 7,098,420 B2 * | 8/2006 | Crowe et al. ............. 219/121.43 |
| 2004/0247886 A1 * | 12/2004 | Kudo et al. .................... 428/421 |
| 2005/0133927 A1 * | 6/2005 | Rosocha et al. ............... 257/768 |
| 2005/0178330 A1 * | 8/2005 | Goodwin et al. ......... 118/723 E |

FOREIGN PATENT DOCUMENTS

| AT | 26 192 | 4/1987 |
| DE | 198 21 244 | 12/1999 |
| DE | 100 47 688 | 5/2002 |
| DE | 198 26 418 | 7/2003 |
| DE | 102 03 543 | 10/2003 |
| DE | 10 2005 002 142.5-54 | 1/2006 |

(Continued)

OTHER PUBLICATIONS

Andreas Schutze et al, "The Atmospheric-Pressure Plasma Jet: A Review and Comparison to Other Plasma Sources", IEEE Transactions on Plasma Science, vol. 26, No. 6, Dec. 6, 1998.

(Continued)

*Primary Examiner* — Xiuyu Tai
(74) *Attorney, Agent, or Firm* — Workman Nydegger

(57) ABSTRACT

A microplasma array for the production of low-temperature plasmas at or near atmospheric pressures is described. The walls of holes made in a substrate at regular intervals with respect to one another form hollow electrodes and are coated with metal. The hollow electrodes are supplied individually or as a group from one side of the substrate with an electrical excitation in the GHz-region.

17 Claims, 1 Drawing Sheet

(56) References Cited

FOREIGN PATENT DOCUMENTS

| | | |
|---|---|---|
| WO | WO 00/65887 | 11/2000 |
| WO | WO 00/79843 | 12/2000 |
| WO | WO 2004/024280 | 3/2004 |
| WO | WO 2004/032176 | 4/2004 |

OTHER PUBLICATIONS

Mounir Laroussi; Nonthermal Decontamination of Biological Media by Atmospheric-Pressure Plasmas: Review, Analysis and Prospects; IEEE Transactions of Plasma Science; vol. 30, No. 4; Aug. 2002.

L Baars-Hibbe; Micro-Structured Electrode Arrays; Atmospheric Pressure Plasma Processes-Characterization and New Applications; Institute Fur Mikotechnik, Braungschweig, Germany.

E Stoffels; Plasma Needle: A Non-Destructive Atmospheric Plasma Source for Fine Surface Treatment of (BIO)Materials; Institute of Physics Publishing; Eindhoven, The Netherlands; Published: Aug. 30, 2002.

Yoou-Bin Guo et al; "Radio-frequency microdischarge arrays for large-area cold atmospheric plasma generation", Applied Physics Letters, vol. 82, No. 3, Jan. 20, 2003, pp. 337-339.

H. Báranková et al.; "Fused hollow cathode cold atmospheric plasma", Applied Physics Letters, vol. 76, No. 3, Jan. 17, 2000, pp. 285-287.

* cited by examiner

MICROPLASMA ARRAY

CROSS-REFERENCE TO RELATED APPLICATIONS

This application is a United States nationalization of International Application No. PCT/EP2006/050157 filed Jan. 11, 2006, which claims priority to German Application Serial No. 10 2005 002 142.5 filed Jan. 12, 2005, each of which is incorporated herein by reference in its entirety.

FIELD OF THE INVENTION

The invention concerns a microplasma array for producing low-temperature plasmas at or near atmospheric pressures.

BACKGROUND OF THE INVENTION

Plasmas are used in many sedimentation-, etching-, and layer formation processes.

In plasma reactors that produce a low temperature plasma, either a high frequency voltage of 10 to 30 MHz is applied to two parallel plate electrodes, or microwaves in the GHz region are introduced into a vacuum chamber, in which case more than 500 watts are required.

The most recent attempts involve attempts to produce suitable low-temperature plasmas even under non-vacuum conditions. Such reactors operate with corona discharges or glow discharges. An overview of such plasma generators can be found in Laroussi, Nonthermal Decontamination of Biological Media by Atmospheric-Pressure Plasmas: Review, Analysis, and Prospects, IEEE Transactions in Plasma Science, Vol. 30, No. 4, August 2002, pp. 1409-1415, and also in Schuetze et al. The Atmospheric-Pressure Plasma Jet: A Review and Comparison to Other Plasma Sources, loc. cit., Vol. 26, No. 6, December 1998. The plasma reactions described here are to be used, among other applications, in biological and medical purposes. Aside from the costs encountered with plasma reactors that operate under vacuum, the use of low pressures must often be excluded in this region, so that here the use of an atmospheric pressure plasma is required. Likewise, a treatment of vacuum-sensitive materials, such as certain polymers or sensitive foods, is possible with low-temperature plasmas at or near atmospheric pressures.

So-called plasma needles have already been described in which plasmas produced at a high-frequency electrode in a cylinder through which a process gas flows are suited for use in plasma surgery or for plasma dental treatment, among other applications, see Stoffels et al., Plasma needle: a nondestructive atmospheric plasma source for fine surface treatment of (bio)materials, Plasma Sources Sci. Technol. 11 (2002, pp. 383-388.)

Efforts at reducing the dimensions of plasma reactors for biological and medical, as well as for other purposes, has led to so-called microstructured electrode arrays (MSE) that operate at voltages below 400 V in the 10 MHz-region with structured comb-like electrodes, see Baars-Hibbe et al., Micro-structured electrode arrays: Atmospheric pressure plasma process—characterization and new applications, www.icpig.uni-greifswald.de/proceedings/data/Baars-hibbe 1.

Arrays like so-called MHCD Devices (microhollow cathode discharge) are known, in particular, for applications involving light technology (excimer lasers, fluorescent lamps). In this case microholes are formed in a conducting cathode material. The region remaining between the microholes is coated with a dielectric. An anode lies opposite the entire cathode. The microholes are formed as blind holes for specific applications (U.S. Pat. No. 5,686,789) or they penetrate through the cathode and an underlying substrate material (DE 198 21 244). However, the latter do not operate with a sufficient plasma density for coating tasks.

BRIEF SUMMARY

The underlying object of the invention is to produce a microplasma array of the type described in the introduction, which is suitable for activating a gas stream with high efficiency and for generating a higher density plasma that is picked up by the gas stream.

The object is achieved according to the invention by the features of claim 1. Advantageous embodiments are described in the subclaims.

The array consists of a substrate in which holes are formed at regular intervals with respect to one another. The walls of the holes made in the substrate forming hollow electrodes are coated with metal. These hollow electrodes are supplied individually or as a group from one side of the substrate with an electrical excitation in the GHz-region.

The use of very high frequencies has the advantage that a high plasma density is achieved and improves the ignition characteristics of the plasma.

The hollow electrodes advantageously have a cylindrical cross section, but can also have other cross sectional shapes. The diameter region of the hollow electrodes should preferentially lie between 1 pm and 1 mm, with the lengths of the hollow electrodes lying between 100 μm and 10 mm.

For special applications, the metallic walls of the hollow electrodes can be provided with an insulating coating, especially when the electrode material might disturb the process chemically. Furthermore, flashover can occur on the electrode. The coating helps to avoid and extinguish this process and thereby reduces electrode wear.

In order to improve the ignition behavior of the plasma array, an additional electrode provided with holes is located on the opposite side of the substrate from the lead for the electrical excitation, these holes having the corresponding location and diameter as the hollow electrodes. The interval between the hollow electrodes and the other electrodes should be as small as possible, and not greater than 500 μm. The interval can, for example, be achieved by an intermediate insulating layer.

A ceramic or a ceramic compound (eg., Duroid, Standard-Microwave-Printed Circuit Board material) can be advantageously be used as the substrate material. For future integration, semiconductor materials are also a possibility. The holes are either formed with a laser, or etched (plasma)chemically by a laser with a photomask. The hollow electrode itself is then galvanically formed or produced by vacuum coating (PVD, CVD).

The oscillators delivering the respective excitation can be integrated with the substrate, and expediently on the side with the leads for the electrical excitation, the hollow electrodes forming a part of the oscillator circuit.

In order that the plasma cells of the microplasma array be controlled individually or as a group, a structured treatment of the surfaces is possible. The plasma can also be moved relative to the surfaces of the object being treated. It is also possible for moving objects to be treated along with the coincident movement of the plasma with the object, so that the plasma acts only in a specific region despite the motion of the object.

A plasma array produced according to the invention can be used, for example, for

- plasma sources for the in-situ sterilization of (food-) packaging, medical devices, and tissues,
- functionalization and coating in the area of biomedical applications and diagnostic systems, eg., in the areas of tissue engineering, medication emitting implants
- plasma radiation sources for health-promoting light systems, UV-sources for degermination
- mobile applications in the household and leisure areas, eg., for the removal of organic pollutants in household textiles, noise abatement in homes and automobiles
    - functional surface finishing of packaging, plastics, glass, and textile tissues
    - the manufacture and finishing of nano-powders for diagnostic purposes or for the production of complex materials
    - the manufacture of thin layers, eg., roll-up or formed solar cells or thin layer sensors

BRIEF DESCRIPTION OF THE DRAWINGS

The invention will now be described in greater detail with the aid of an embodiment. The attached drawings show FIG. 1 the view of a plasma array according to the invention, and FIG. 2 a cross section through an individual cell of such a plasma array.

DETAILED DESCRIPTION

Figure 1:
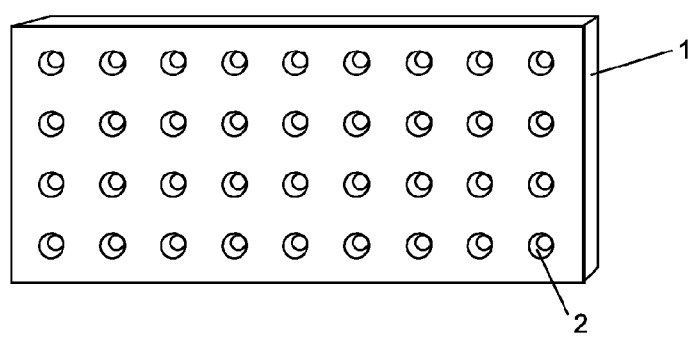

FIG. 1 shows an overall view of a plasma array according to the invention with 4×9 individual plasma cells, characterized by hollow electrodes 2 formed in a substrate 1.

Figure 2:
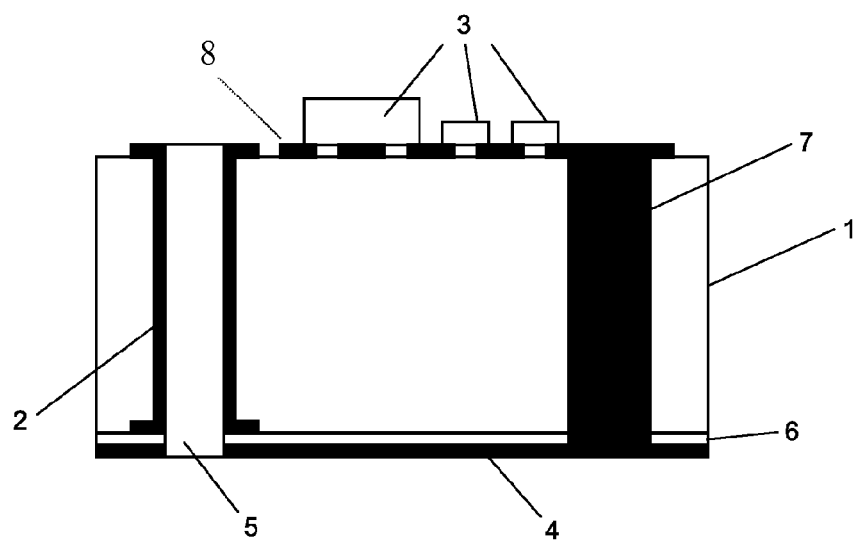

FIG. 2 shows a cross sectional view of an individual plasma cell. The hollow electrode 2 is formed by a metallic coating of a microhole made in the substrate 1. Formation of the holes and their coating is done with the well-known methods used in semiconductor technology. On the upper side of substrate 1 the hollow electrode 2 is connected with a freely-oscillating oscillator 3, integrated into substrate 1, which is designed, e.g., with a frequency of 5.8 GHz (ISM-frequency). The arrangement of oscillators 3 directly on the substrate 1 makes the array into a fully-independent component that only requires a voltage source. The power of an individual plasma cell can be limited to less than 10 watts so that plasmas can be formed with very small energy input, which also enables good scalability, as well as the possibility of group level or even individual control of plasma cells.

The substrate 1 consists of a 500 μm thick ceramic material, for example, Duroid. The hollow electrodes 2 have a diameter of 100 μm. They can also, as mentioned above, be passivated by an insulating coating.

In order to assure an immediate plasma ignition in the hollow electrodes 2 upon excitation, an additional electrode 4 (anode) is placed on the underside of the substrate 1, which has holes at the positions corresponding to the hollow electrodes 2, so that a respective spark gap 5 is formed. The electrode 4 is connected to ground potential. The connection to ground on the upper side of the substrate occurs advantageously by means of a ground connection 7 through another hole in substrate 1. The ground connection 7 is manufactured analogously to the manufacture of hollow electrodes 2. The ground connection 7 can be hollow or galvanically filled, or can be filled with solder in a subsequent operational step.

The spark gap 5 is assured by an additional deposited insulating layer 6 between the electrode 4 and the substrate 1. the insulating layer 6 has a thickness of approximately 20 μm, and also consists of a ceramic material.

Upon ignition, free electrons, which are always present in low density, are accelerated so that when they collide with gas molecules they have enough energy to knock additional electrons out of the gas molecules. This gives rise to additional free electrons (avalanche effect) and ions. Under appropriate conditions (type of gas, pressure, field strengths) the ionization increases to an equilibrium value at which the new collision ionization is equal to the electron losses. The electron losses arise by recombination (with light, UV, IR-emissions) and by wall losses (electrons being removed from the plasma region). A high field strength is required for ignition, which can be achieved by a small interval of separation at limited voltage, in this case by the small spark gap 5. Following ignition, the plasma forms a conducting medium with an extraordinarily complex behavior. It does not remain localized in the spark gap after ignition, since then the loading of the electrodes would be very large at small volumes and high temperatures, a problem that arises in all "bipolar" arrangements. It should expand into the hollow electrodes 2 and essentially fill them, thereby forming a coaxial line structure (the electrode is the outer conductor and the plasma is the inner conductor).

LIST OF REFERENCE SYMBOLS 1 substrate
2 hollow electrode
3 oscillator
4 electrode
5 spark gap
6 insulating layer
7 ground connection

The invention claimed is:

1. A microplasma array for the production of low-temperature plasmas at or near atmospheric pressures wherein the walls of holes made in a substrate at regular intervals with respect to one another forming hollow electrodes include a metal coating, and these hollow electrodes are supplied individually or as a group from one side of the substrate with an electrical excitation in the GHz-region, the microplasma array further comprises at least one GHz-oscillator for delivering the respective excitation, wherein the GHz-oscillators are integrated on the substrate on the side of the leads of the electrical excitation; wherein the hollow electrodes form a part of the at least one GHz-oscillator.

2. The microplasma array of claim 1, wherein the hollow electrodes have a cylindrical cross section.

3. The microplasma array of claim 2, wherein the diameter of the hollow electrodes is less than 1 mm.

4. The microplasma array of claim 3, wherein the metallic walls of the hollow electrodes are provided with an insulating coating.

5. The microplasma array of claim 4, wherein an electrode comprising holes is located on the side of the substrate opposite that of the leads of the electrical excitation, these holes essentially corresponding to the position and diameter of the hollow electrodes.

6. The microplasma array of claim 5, wherein the interval between the hollow electrodes and the other electrodes is smaller than 500 μm.

7. A microplasma array for the production of low-temperature plasmas at or near atmospheric pressures wherein the walls of holes made in a substrate at regular intervals with respect to one another forming hollow electrodes include a metal coating, and these hollow electrodes are supplied individually or as a group from one side of the substrate with an electrical excitation in the GHz-region, wherein the diameter of the hollow electrodes is less than 1 mm, wherein the microplasma array further comprises at least one GHz-oscillator for delivering the respective excitation, wherein the GHz-oscillators are integrated on the substrate on the side of the leads of the electrical excitation; wherein the hollow electrodes form a part of the at least one GHz-oscillator.

8. The microplasma array of claim 7, wherein the hollow electrodes have a cylindrical cross section.

9. The microplasma array of claim 8, wherein the metallic walls of the hollow electrodes are provided with an insulating coating.

10. The microplasma array of claim 9, wherein an electrode comprising holes is located on the side of the substrate opposite that of the leads of the electrical excitation, these holes essentially corresponding to the position and diameter of the hollow electrodes.

11. The microplasma array of claim 10, wherein the interval between the hollow electrodes and the other electrodes is smaller than 500 μm.

12. A microplasma array for the production of low-temperature plasmas at or near atmospheric pressures wherein the walls of holes made in a substrate at regular intervals with respect to one another forming hollow electrodes that include a metal coating, and these hollow electrodes are supplied individually or as a group from one side of the substrate with an electrical excitation in the GHz-region, wherein the metallic walls of the hollow electrodes are provided with an insulating coating, wherein the microplasma array further comprises at least one GHz-oscillator for delivering the respective excitation, wherein the GHz-oscillators are integrated on the substrate on the side of the leads of the electrical excitation; wherein the hollow electrodes form a part of the at least one GHz-oscillator.

13. The microplasma array of claim 12, wherein the hollow electrodes have a cylindrical cross section.

14. The microplasma array of claim 13, wherein the diameter of the hollow electrodes is less than 1 mm.

15. The microplasma array of claim 14, wherein an electrode comprising holes is located on the side of the substrate opposite that of the leads of the electrical excitation, these holes essentially corresponding to the position and diameter of the hollow electrodes.

16. The microplasma array of claim 15, wherein the interval between the hollow electrodes and the other electrodes is smaller than 500 μm.

17. A microplasma array for the production of low-temperature plasmas at or near atmospheric pressures, the array comprising:
a substrate having a first side and an opposing second side;
a plurality of hollow electrodes formed in the substrate, the hollow electrodes each comprising:
a wall bounding a hole extending through the substrate between the first and second sides, the wall including a metal coating; and
a lead formed on the first side of the substrate, the lead electrically coupled with the coated wall, wherein the holes extend through the substrate at regular intervals with respect to one another;
at least one GHz-oscillator integrated on the first side of the substrate, wherein the hollow electrodes form a part of the at least one GHz-oscillator, the at least one GHz-oscillator delivering an electrical excitation having a frequency in the GHz-region to at least one of the hollow electrodes through the leads of the at least one hollow electrodes, the hollow electrodes being supplied individually or as a group with the electrical excitation.

\* \* \* \* \*